US008759877B2

(12) United States Patent
Shih et al.

(10) Patent No.: US 8,759,877 B2
(45) Date of Patent: Jun. 24, 2014

(54) STRESS RELEASE STRUCTURES FOR METAL ELECTRODES OF SEMICONDUCTOR DEVICES

(76) Inventors: Ishiang Shih, Brossard (CA); Cindy Xing Qiu, Brossard (CA); Chunong Qiu, Brossard (CA); Yi-Chi Shih, Palos Verdes Estates, CA (US)

( * ) Notice: Subject to any disclaimer, the term of this patent is extended or adjusted under 35 U.S.C. 154(b) by 664 days.

(21) Appl. No.: 12/802,152

(22) Filed: Jun. 1, 2010

(65) Prior Publication Data

US 2011/0291159 A1  Dec. 1, 2011

(51) Int. Cl.
*H01L 29/66* (2006.01)
*H01L 29/20* (2006.01)
*H01L 29/778* (2006.01)

(52) U.S. Cl.
CPC ........ *H01L 29/2003* (2013.01); *H01L 29/7787* (2013.01)

USPC .................................. 257/194; 257/E29.246

(58) Field of Classification Search
CPC ........................ H01L 29/2003; H01L 29/7787
USPC ........................................... 257/194, E29.246
See application file for complete search history.

(56) References Cited

U.S. PATENT DOCUMENTS

2008/0087916 A1 *  4/2008  Amasuga et al. ............. 257/194
2011/0147798 A1 *  6/2011  Radosavljevic et al. ...... 257/194

* cited by examiner

*Primary Examiner* — Ha Tran T Nguyen
*Assistant Examiner* — Aaron Dehne

(57) ABSTRACT

This invention teaches stress release metal electrodes for gate, drain and source in a field effect transistor and stress release metal electrodes for emitter, base and collector in a bipolar transistor. Due to the large difference in the thermal expansion coefficients between semiconductor materials and metal electrodes, significant strain and stresses can be induced in the devices during the fabrication and operation. The present invention provides metal electrode with stress release structures to reduce the strain and stresses in these devices.

9 Claims, 4 Drawing Sheets

Prior Art

Prior Art

STRESS RELEASE STRUCTURES FOR METAL ELECTRODES OF SEMICONDUCTOR DEVICES

FIELD OF INVENTION

This invention relates to metal electrodes for gate, drain and source in a field effect transistor and metal electrodes for emitter, base and collector in a bipolar transistor. Due to the large difference in the thermal expansion coefficients between epitaxial materials and metal electrodes, significant strain and stresses can be induced in the devices during the fabrication and operation. The present invention provides metal electrode with stress release structures to reduce the un-wanted strain or stresses in these devices.

BACKGROUND OF THE INVENTION

In electronic circuits, devices in the forms of bipolar junction transistor (BJT), heterojunction bipolar transistor (HBT), metal semiconductor field effect transistor (MESFET), metal oxide semiconductor field effect transistor (MOSFET), pseudomorphic high electron mobility field effect transistor (pHEMT) and metamorphic high electron mobility field effect transistor (mHEMT) are used for switching and amplification, whereas devices in the forms of p-n junction and Schottky junction are used as rectifiers. The semiconductors for the above devices may be selected from a group of Si, Si/Ge, GaAs, InGaAs, GaN, InGaN, AlInN and etc. For high power applications, the above-mentioned devices are operated at high current densities and the un-wanted joule heating in the semiconductor regions and interfaces between the semiconductor and metal electrodes is high. The un-wanted joule heating leads to an increase in the temperature of the devices and circuits. Take GaN HEMTs as an example, the local channel temperature can be as high as 500-1000 K at a bias voltage of 20 V. In addition to the variation of temperatures during the operation, the devices and circuits may go through heating process during the fabrication and after the metal electrodes have been deposited.

It is noted that for the formation of metal electrodes, the selection of materials is determined by the following considerations: [1] low electrode resistance, [2] good adhesion, [3] low thermal diffusion, and [4] good stability. Due to these requirements, materials for forming metal electrodes in electronic devices are limited. For III-V compounds, various metals such as Ti, Al, Au, Ge, Ni, Pd, Zn, W and their combinations have been developed for both ohmic electrodes and Schottky electrodes. For Si based devices and circuits, materials for metal electrodes are often selected from a group of W, $WSi_2$, Ti, TiN, Cu, Al, $TaSi_2$, $TiSi_2$, etc.

As shown in Table 1, although the above-described materials are suitable for forming low resistance electrodes to the semiconductors listed, their thermal expansion coefficients are substantially larger than that of the semiconductors in the list. Therefore, during the fabrication or operation when the temperatures are raised, there is more severe expansion of the metal electrodes on the semiconductor substrate than that of the semiconductor, causing tensile stresses in the semiconductors and the interfaces. Contrarily, when the temperatures are reduced, the shrinkage of the metal electrodes is more severe than that of the semiconductors, causing a compressive stresses in the semiconductors and the interfaces. Microscopic defects are often formed in semiconductors due to these strain and stresses. The formation of these microscopic defects may lead to performance degradation and lifetime reduction in the devices.

TABLE 1

Thermal expansion coefficients of some materials

| Material | Coefficient ($\times 10^{-6}$/K) | Material | Coefficient ($\times 10^{-6}$/K) |
| --- | --- | --- | --- |
| GaAs | 5.73 | Au | 14.1 |
| InGaAs | 5.05 | Cu | 17 |
| InP | 4.6 | Ti | 9 |
| Ge | 5.6 | Ni | 13 |
| Si | 3.2 | Al | 23 (12.9) |
| GaN | 4 | AlN | 4.5 |
| InN | 3 | Alumina | 6-7 |
| Sapphire | 4.5 | Silicon carbide | 3.2 |
| Epoxy Resin | 10-100 | | |

For power devices operated at high frequencies, the power density can not be easily reduced due to the limitation of phase delay. A typical power density is 1 W per mm length of the metal electrodes for GaAs-based devices. Such high power density will cause elevated temperatures in the channel layers. Take HEMTs for power application as an example, the GaAs-based semiconductor channel temperature can rise to 150° C. whereas the ones based on GaN can be more than 200° C. Formation of microscopic defects in the semiconductor channels caused by strain and stresses is therefore inevitable during fabrication and operation, especially for power devices.

SUMMARY OF THE INVENTION

The un-wanted temperature-change-induced stresses on the semiconductors in a device are substantially reduced using a metal electrode structure have a plurality of stress release sections comprising: A substrate with semiconductor layers and metal electrodes, each of the metal electrodes has a plurality of stress release sections; each of the stress release sections has a section length, separated from semiconductor top surface by a cavity having a cavity height. The section distance between adjacent stress release sections is selected to be substantially greater than emitter electrode width. With the presence of the stress release sections according to this invention, a portion of the stresses to be induced in the semiconductor layers will be distributed to the stress release sections and absorbed by them through slight deformation of the stress release sections. Hence, the un-wanted induction of stresses in the semiconductor layers and the associated defects will be reduced.

DESCRIPTION OF THE DRAWINGS

FIG. 1a shows a schematic cross-sectional view of a prior art (HBT) device, 1b-1d are cross-sectional views along A-A'. B-B' and C-C' taken at different portions of the HBT device in 1a.

DETAILED DESCRIPTION OF THE PREFERRED EMBODIMENTS

Heterojunction Bipolar Transistors (HBTs)

Figure 1A:
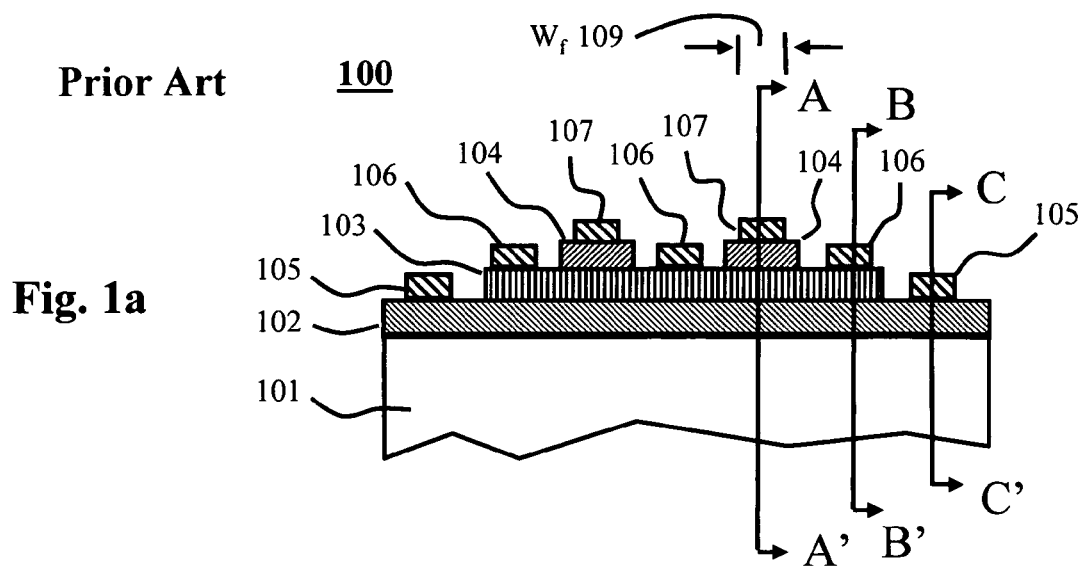
Figure 1B:
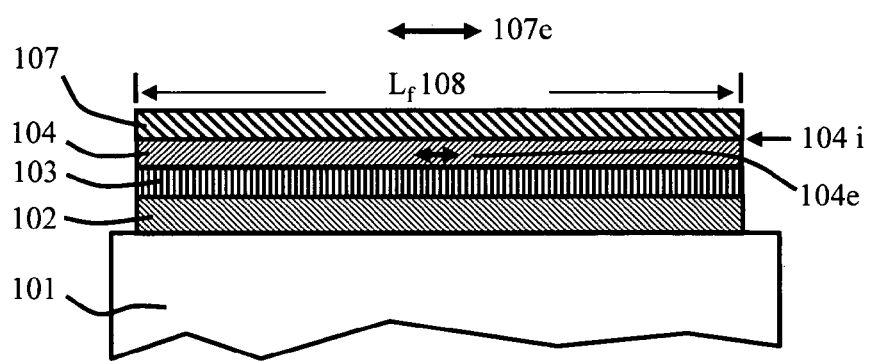
Figure 1C:
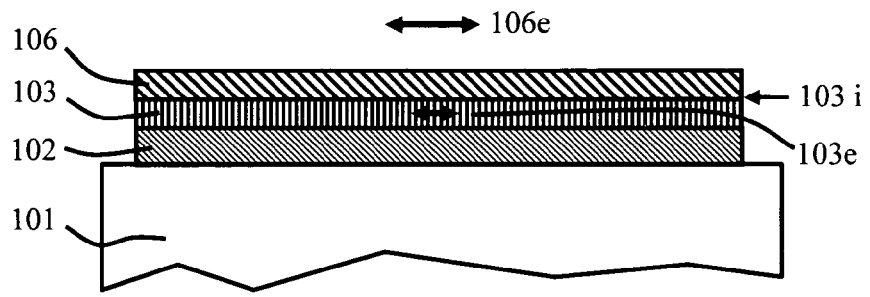
Figure 1D:
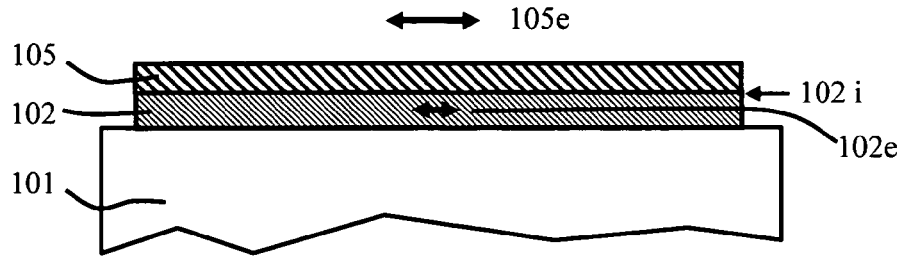

FIG. 1a shows a schematic side view of a simplified prior art heterojunction bipolar transistor (HBT) structure (100), which includes a substrate (101), a collector layer (102), a base layer (103) and an emitter layer (104). Electrical contacts are obtained from collector electrodes (105), base electrodes (106) and emitter electrodes (107). The materials for base electrodes may be different from those used for the collector electrodes and emitter electrodes, due to the difference in the conduction types. FIG. 1b illustrates a cross-sectional view along line A-A', FIG. 1c shows a cross-sectional view along B-B' whereas FIG. 1d is a C-C' cross-sectional view of the prior art HBT structure (100). When the temperature of the HBT structure (100) is raised during fabrication or operation, the emitter metal expansion (107e) of the emitter-electrodes (107) will be greater than the emitter layer expansion (104e), as shown in FIG. 1b. Similarly, the base metal expansion (106e) of the base electrodes (106) will be greater than the base layer expansion (103e, FIG. 1c) whereas the collector metal expansion (105e, FIG. 1d) of the collector electrodes (105) will be greater than the collector layer expansion (102e). Above differences in corresponding expansions due to the difference in the expansion coefficients will be more severe when the emitter electrode length ($L_f$ 108) is large compared to the emitter electrode width ($W_f$ 109 in FIG. 1a). This induces stresses in the sandwiched emitter (104), base (103) and collector (102) layers. Similarly, stresses will be induced in the sandwiched base (103) and collector (102) layers due to larger expansion (106e) in base electrode (106), and in the collector layer (102) due to larger expansion (105e) in the collector electrodes (105). In addition, stresses will also be induced in the emitter layer/emitter electrode interface (104i, FIG. 1b), the base layer/base layer electrode interface (103i, FIG. 1c) and the collector layer/collector electrode interface (102i, FIG. 1d), deteriorating adhesion of the metal electrode layers to the semiconductor layers.

Figure 2A:
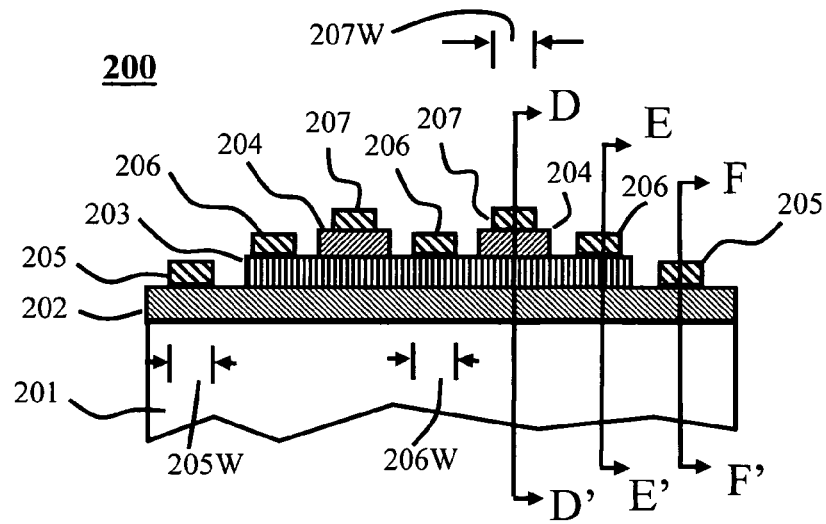
FIG. 2a is a schematic cross-sectional view of the HBT device according to this invention, 2b-2d are cross-sectional views along D-D'. E-E' and F-F' taken at different portions of the HBT device showing stress release sections in metal electrodes according to this invention.
Figure 2B:
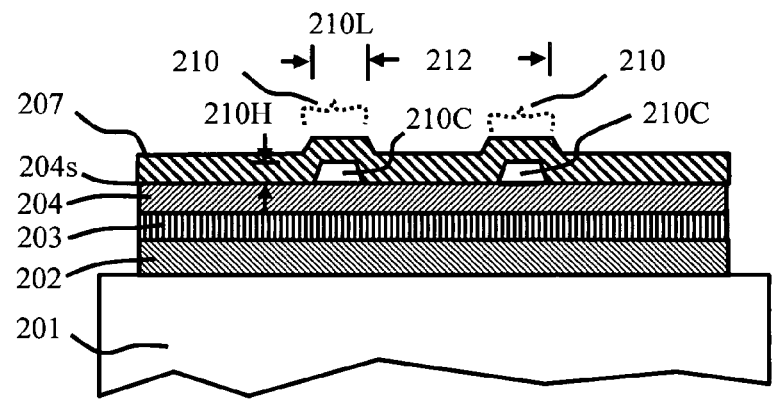
Figure 2C:
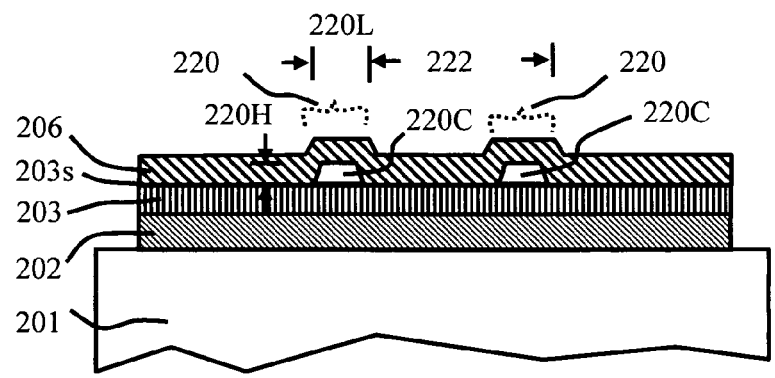
Figure 2D:
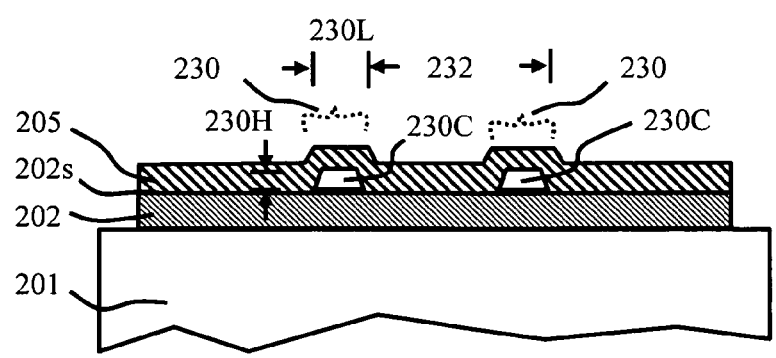

FIG. 2a shows a schematic side view of a simplified HBT structure (200) according to this invention, said structure includes a substrate (201), a collector layer (202), a base layer (203) and an emitter layer (204). Electrical contacts are obtained from collector electrodes (205), base electrodes (206) and emitter electrodes (207). The materials for base electrodes may be different from those used for the collector electrodes and emitter electrodes, due to the difference in the conduction types. FIG. 2b illustrates a cross-sectional view of the simplified HBT structure (200) along line D-D'. An E-E' cross-sectional view and an F-F' cross-sectional view of the device (200) is illustrated respectively in FIGS. 2c and 2d.

According to an embodiment of this invention, a plurality of emitter stress release sections (210) is provided in the emitter electrodes (207) (see FIG. 2b), each of the emitter stress release sections (210) has a section length (210L), separated from emitter front surface (204s) by a emitter cavity (210C) having a emitter cavity height (210H). The section distance (212) between two adjacent emitter stress release sections is selected to be substantially greater than emitter electrode width (207W, FIG. 2a). With the presence of the emitter stress release sections (210) according to this invention, a portion of the stresses to be induced in the sandwiched emitter (204), base (203) and collector (202) layers due to the emitter electrodes (207) will be distributed to the emitter stress release sections (210) and absorbed by them through slight deformation of the emitter stress release sections. Hence, the un-wanted induction of stresses in the semiconductor layers will be reduced.

According to another embodiment of this invention, a plurality of base stress release sections (220, FIG. 2c) in the base electrodes (206) is provided, each of the base stress release sections (220) has a length (220L), separated from base front surface (203s) by a base cavity (220C) having a base cavity height (220H). The section distance (222) between two adjacent base stress release sections is selected to be substantially greater than base electrode width (206W, FIG. 2a). With the presence of the base stress release sections (220) according to this invention, a portion of the stresses to be induced in the sandwiched base (203) and collector (202) layers due to the base electrodes (206) will be distributed to the base stress release sections and absorbed by them through slight deformation of the base stress release sections. Hence, the un-wanted induction of stresses in the semiconductor layers (203, 202) will be reduced.

According to still another embodiment of this invention, a plurality of collector stress release sections (230, FIG. 2d) in the collector electrodes (205) is provided, each of the collector stress release sections (230) has a length (230L), separated from collector front surface (202s) by a collector cavity (230C) having a collector cavity height (230H). The section distance (232) between adjacent collector stress release sections is selected to be substantially greater than collector electrode width (205W, FIG. 2a). With the presence of the collector stress release sections (230) according to this invention, a portion of the stresses to be induced in the collector layer (202) due to the collector electrodes (205) will be distributed to the collector stress release sections and absorbed by them through slight deformation of the collector stress release sections. Hence, the un-wanted induction of stresses in the semiconductor layer (202) will be reduced.

High Electron Mobility Transistors (HEMTs)

Figure 3A:
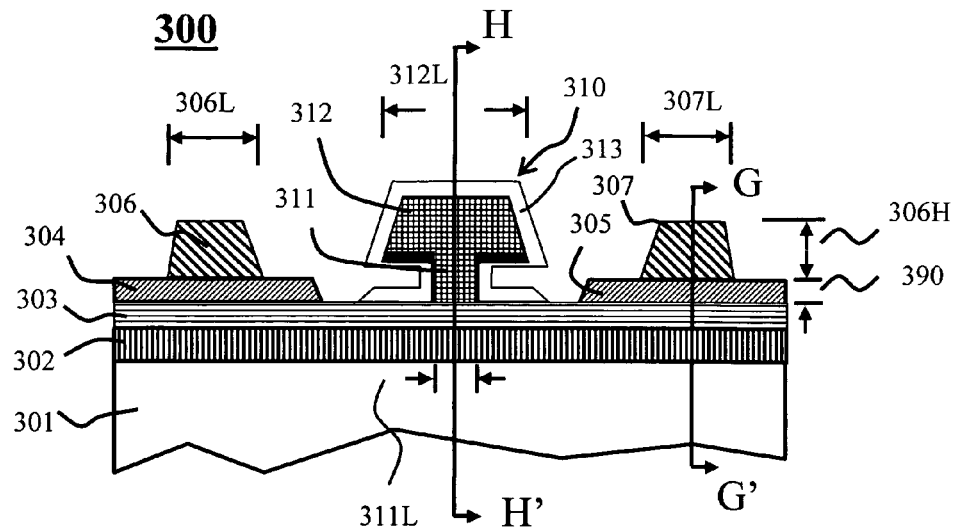
FIG. 3a is a schematic cross-sectional view of a prior art HEMT device, 3b-3c are cross-sectional views of G-G' and H-H' taken at different portions of the HEMT device.

FIG. 3a shows a schematic side view of a simplified prior art HEMT structure (300) which includes a substrate (301), a buffer layer (302), a channel layer (303) and semiconductor contact layers (304, 305) with a thickness (390). Electrical contacts are obtained from a source electrode (306) and a drain electrode (307). The source electrode (306) and the drain electrode (307) have a drain/source electrode height (306H). In the HEMT structure (300), a gate electrode (310) is placed substantially in the central portion of the uncovered channel layer (303). The gate electrode (310) has a stem portion (311) with a gate length (311L) and a head portion (312) having a head portion length (312L). The materials for semiconductor contact layers (304, 305) may be different from those used for the gate electrode (310). To enhance the integrity during operation, a layer of passivation material (313) such as silicon nitride may be deposited.

Figure 3B:
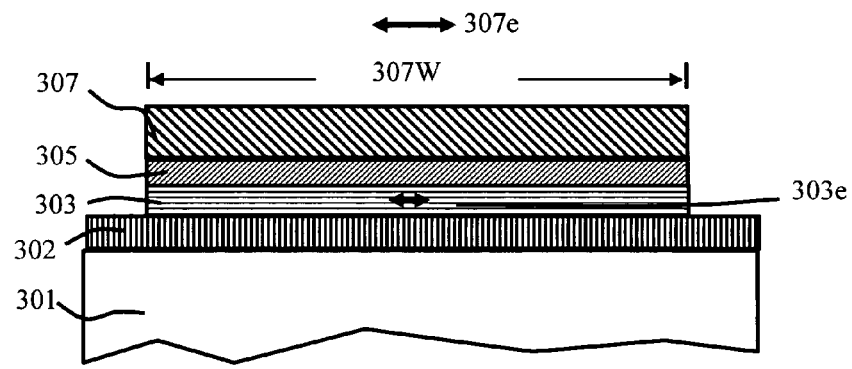
Figure 3C:
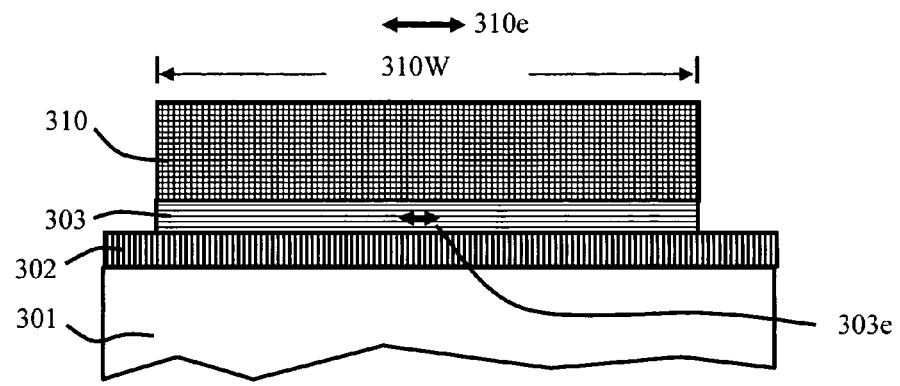

A cross-sectional view along line G-G' of the simplified prior art HEMT structure (300) is shown in FIG. 3b, while a cross-sectional view along the H-H' line of the structure is illustrated in FIG. 3c. When the temperature of the HEMT structure (300) is raised during the fabrication or operation, thermal expansion (307e, FIG. 3b) of the drain electrodes (307) and the drain semiconductor contact layer (305) will be greater than the expansion (303e, FIG. 3b) in the semiconductor channel layer (303) due to differences in the expansion coefficients. In a similar fashion, the thermal expansion (not shown) of the source electrodes (306) and the source semiconductor contact layer (304) will be greater than that in the semiconductor channel layer (303) underneath it. The stresses induced by the expansion differences will be more severe when the widths (307W, FIGS. 3b and 306W, not shown) is large compared to the lengths (306L, 307L, FIG. 3a) of the source/drain metal electrodes (306, 307) and will induce stresses in the sandwiched semiconductor contact layers (304, 305) and the channel layer (303).

Figure 4A:
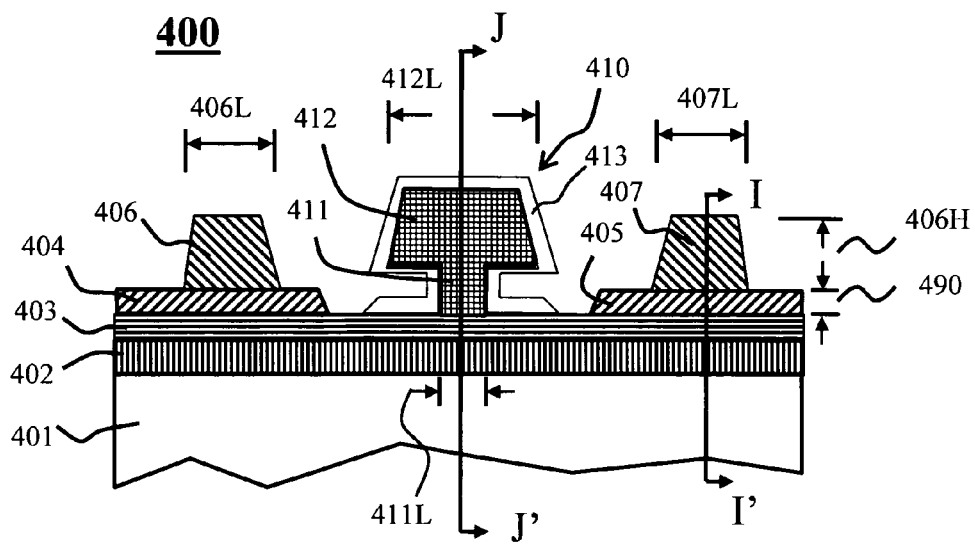
FIG. 4a is a schematic cross-sectional view of the HEMT device according to this invention, 4b-4c are cross-sectional views of I-I' and J-J' taken at different portions of the HEMT device showing stress release sections in metal electrodes according to this invention.

As illustrated in FIG. 3c (the passivation layer 313 is not shown), when the temperature of the structure (300) is raised, the gate metal expansion (310e) of the gate electrode (310) will be greater than the channel layer expansion (303e) which will induce stresses in the channel layer (303) under the stem portion (311) of the gate electrode (310). This expansion difference will be more severe when the width (301W, FIG. 3c) is large compared to the gate length (311L, FIG. 3a). In FIG. 3c, the FIG. 4a shows a schematic side view of a simplified HEMT structure (400) according to the present invention, said structure includes a substrate (401), a buffer layer (402), a channel layer (403) and semiconductor contact layers (404, 405) with a thickness (490). Electrical contacts are obtained from a source electrode (406) and a drain electrode (407). The drain and source electrodes have a drain/source electrode height (406H). The gate electrode (410) is placed substantially in the central portion of channel layer (403) where it is not covered by the semiconductor contact layers (404, 405). The gate electrode (410) has a stem portion (411) with a stem central axis, a stem (or gate) length (411L) and a stem height. The gate electrode also has a head portion (412) having a head central axis, a head length (412L) and a head height. The central axis of the head portion may be in alignment with the central axis of the stem portion forming a T-gate. It may also not be aligned with the central axis of the stem portion forming a I'-gate structure. To enhance the integrity during operation, a layer of passivation material (413) such as silicon nitride may be deposited.

Figure 4B:
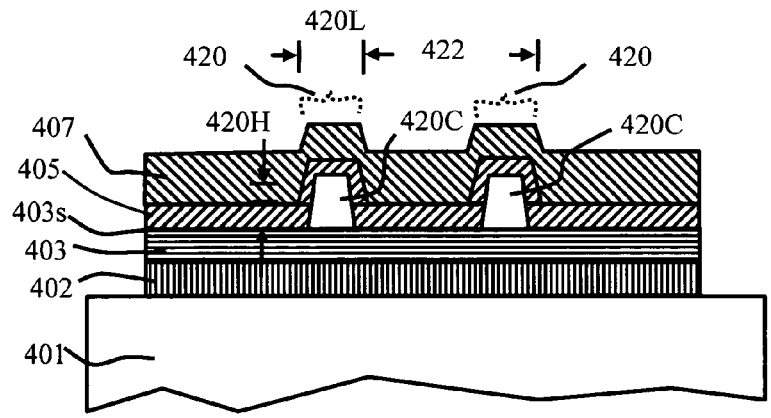

According to one embodiment of this invention, a cross-sectional view along line I-I' of the HEMT structure (400) is shown in FIG. 4b, where a plurality of drain stress release sections (420) is provided in the drain metal layers (405, 407). Each of said drain stress release sections (420) has a section length (420L), separated from channel layer surface (403s) by a drain electrode cavity (420C) having a drain electrode cavity height (420H). According to another embodiment of the invention, a plurality of source stress release section similar to the drain stress release sections (420) is also provided in the source electrodes (406). Each of said source stress release sections has a section length, separated from the semiconductor electrode layer surface (430s) by a source electrode cavity. Since the source stress release sections can have the same structure and dimensions as the drain stress release sections (420), the source stress release sections are not illustrated and described separately.

The section distance (422) between two adjacent drain/source stress release sections is selected to be substantially greater than the drain/source electrode length (406L, 407L, FIG. 4a). With the presence of the drain/source stress release sections according to this invention, a portion of the stresses to be induced in the sandwiched electrode layers and channel layer (403) will be distributed to the drain/source stress release sections and absorbed by them through slight deformation of the drain/source stress release sections. Hence, the un-wanted induction of stresses in the semiconductor layers and the metal semiconductor interface will be reduced.

Figure 4C:
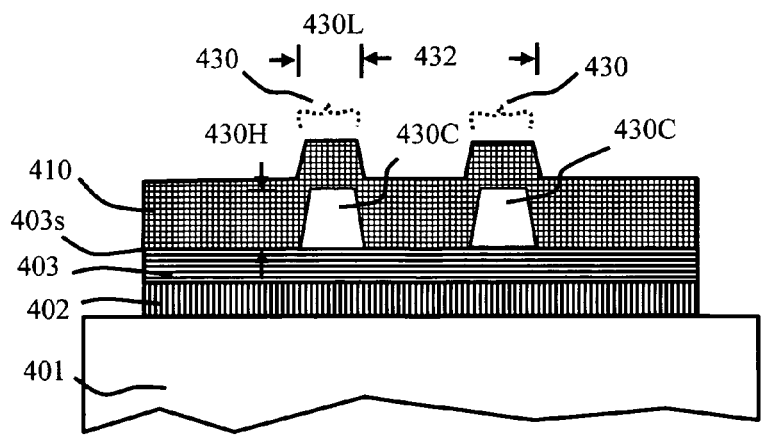

According to another embodiment of the present invention, as shown in a cross-sectional view along J-J' line of the HEMT structure (400) in FIG. 4c (passivation layer 413 is not shown), a plurality of gate stress release sections (430) in the gate electrode (410), each of said gate stress release sections (430) has a length (430L), separated from channel layer surface (403s) by a gate electrode cavity (430C) having a gate electrode cavity height (430H). The section distance (432) between two adjacent stress release sections (430) is selected to be substantially greater than channel length (411L, FIG. 4a). According to this invention, in order to avoid unwanted leakage current in the channel layer (403) introduced by the gate electrode cavities (430C), the charge carriers in the channel layer immediately under the gate electrode cavities (430C) may be removed, dispersed or de-activated, which is done by ion implantation in selected areas using energetic ions of various elements.

With the presence of the gate stress release sections (430) according to this invention, a portion of the stresses to be induced in the channel layer (403) under the stem portion of the gate electrodes (411) due to the expansion differences will be distributed to the gate stress release sections (430) and be absorbed by them through slight deformation of the stress release sections (430). Hence, the un-wanted stresses induced in the channel layers and the gate electrode/channel layer interface will be reduced.

Creation of Corrugated Metal Electrodes

The corrugated drain/source electrodes for a HEMT can be made by creating drain/source sacrificial layer structures to cover selected locations for the stress release sections before the deposition of semiconductor contact layers (404, 405) and the drain/source electrodes (406, 407). After the formation of the drain/source electrodes (406, 407), these drain/source sacrificial layer structures are then removed and leaving suspended sections in the electrodes which are separated from the semiconductor channel layer surface (403s) by a drain/source electrode cavity. The section length of the drain/source stress release sections is determined by the length of the drain/source sacrificial layer structures and the drain/source electrode cavity height is determined by the thickness of the drain/source sacrificial layer structures. The section distance between two adjacent drain/source stress release sections is determined by the distance between two adjacent drain/source sacrificial layer structures.

Similarly, the corrugated gate electrodes for a HEMT can be made by creating gate sacrificial layer structures to cover selected locations for gate stress release sections before the deposition of the gate electrode. After the formation of the gate electrode, these gate sacrificial layer structures are removed and leaving in the gate electrode suspended sections which are separated from the channel layer surface (430s) by a gate electrode cavity. The section length of the gate stress release sections is determined by the length of the gate sacrificial layer structures and the gate electrode cavity height is determined by the thickness of the gate sacrificial layer structures. The section distance between two adjacent gate stress release sections is determined by the distance between two adjacent gate sacrificial layer structures.

The corrugated collector electrodes for a HBT can be created by forming sacrificial layer structures before the deposition of the collector electrodes layer and by removing the sacrificial layer structures after the formation of the collector electrodes. The section length of the stress release sections in the collector electrodes are determined by the length of the scarification layer structures and the collector cavity height is determined by the thickness of the sacrificial layer structures. The section distance between two adjacent collector stress release sections is determined by the distance between two adjacent sacrificial layer structures.

The corrugated base electrodes for a HBT can be created by forming sacrificial layer structures before the deposition of the base electrodes layer and by removing the sacrificial layer structures after the formation of the base electrodes. The section length of the stress release sections in the base electrodes are determined by the length of the scarification layer structures and the base cavity height is determined by the thickness of the sacrificial layer structures. The section distance between two adjacent base stress release sections is determined by the distance between two adjacent sacrificial layer structures.

The corrugated emitter electrodes for a HBT can be created by forming sacrificial layer structures before the deposition of the emitter electrodes layer and by removing the sacrificial layer structures after the formation of the emitter electrodes. The section length of the stress release sections in the emitter electrodes are determined by the length of the scarification layer structures and the emitter cavity height is determined by the thickness of the sacrificial layer structures. The section distance between two adjacent emitter stress release sections is determined by the distance between two adjacent sacrificial layer structures.

Although the description of the present invention is made with reference to a structure of HBT and a structure of HEMT, the structures provided for reducing stresses are equally applicable to MESFET, MOSFET and two terminal devices such as LED, Lasers. Therefore, the spirit of the present invention should not be considered to be limited to the HBT and HEMT.

What is claimed is:

1. A high electron mobility transistor with stress release metal electrodes comprising:
    a substrate with a buffer layer;
    at least one channel layer with a front surface covers a portion of said buffer layer;
    a drain semiconductor contact layer covers a portion of said channel layer;
    a drain electrode covers at least a portion of said drain semiconductor contact layer;
    a source semiconductor contact layer covers a second portion of said channel layer;
    a source electrode covers at least a portion of said source semiconductor contact layer;
    a gate electrode covers a central portion of said channel layer having a gate length, a gate width, and a bottom surface contacting said front surface of said channel layer, wherein said gate electrode has a plurality of gate stress release sections along said gate width of said gate electrode, each of said gate stress release sections has a section length and provides a bubble-like gate electrode cavity embedded in said gate electrode, causing at least a portion of said bottom surface of said gate electrode at location of each said stress release section from contacting said front surface of said channel layer, each said gate electrode cavity has a gate electrode cavity height.

2. A high electron mobility transistor with stress release metal electrodes as defined in claim 1, wherein charge carriers in said channel layer under each said gate electrode cavity is removed or dispersed by ion implantation in selected areas using energetic ions of various elements to eliminate unwanted leakage current in said channel layer.

3. A high electron mobility transistor with stress release metal electrodes as defined in claim 1, wherein said gate electrode has a stem portion and a head portion, said stem portion having a stem central axis, a stem height and a stem length and said head portion having a head central axis, a head height and a head length.

4. A high electron mobility transistor with stress release metal electrodes as defined in claim 1, wherein section distance between two adjacent gate stress release sections is selected to be substantially greater than channel length of said high electron mobility transistor.

5. A high electron mobility transistor with stress release metal electrodes as defined in claim 1, wherein said gate stress release sections are fabricated at the time the gate electrode is formed.

6. A high electron mobility transistor with stress release metal electrodes as defined in claim 1, wherein said drain electrode and drain semiconductor contact layer further comprising a plurality of drain stress release sections, each of said drain stress release sections has a section length and is separated from said front surface of said channel layer by a drain electrode cavity with a drain electrode cavity height, wherein section distance between two adjacent drain stress release sections is selected to be substantially greater than length of said drain electrode, said drain stress release sections are fabricated by creating drain sacrificial layer structures before deposition of said drain semiconductor contact layer and by removing said drain sacrificial layer structures after formation of said drain electrode.

7. A high electron mobility transistor with stress release metal electrodes as defined in claim 1, wherein said source electrode and source semiconductor contact layer further comprising a plurality of source stress release sections, each of said source stress release sections has a section length and is separated from said front surface of said channel layer by a source electrode cavity with a source electrode cavity height, wherein section distance between two adjacent source stress release sections is selected to be substantially greater than length of said source electrode, said source stress release sections are fabricated by creating source sacrificial layer structures before deposition of said source semiconductor contact layer and by removing said source sacrificial layer structures after formation of said source electrode.

8. A high electron mobility transistor with stress release metal electrodes as defined in claim 1, wherein materials of said drain electrode, source electrodes, drain semiconductor contact layer, source semiconductor contact layer and gate electrode are selected from a group of metals and metal alloys.

9. A high electron mobility transistor with stress release metal electrodes as defined in claim 1, further comprising a passivation layer covering surface of said high electron mobility transistor.

* * * * *